United States Patent
Peoples

(10) Patent No.: US 10,726,684 B2
(45) Date of Patent: Jul. 28, 2020

(54) ELECTRONIC DEVICE TRACKING ASSEMBLY

(71) Applicant: Erman Peoples, Indianapolis, IN (US)

(72) Inventor: Erman Peoples, Indianapolis, IN (US)

( * ) Notice: Subject to any disclaimer, the term of this patent is extended or adjusted under 35 U.S.C. 154(b) by 0 days.

(21) Appl. No.: 16/220,129

(22) Filed: Dec. 14, 2018

(65) Prior Publication Data

US 2020/0193783 A1 Jun. 18, 2020

(51) Int. Cl.
| | |
|---|---|
| *G08B 21/24* | (2006.01) |
| *G08B 3/10* | (2006.01) |
| *H04W 64/00* | (2009.01) |
| *H04W 4/029* | (2018.01) |
| *H01H 13/7057* | (2006.01) |
| *H03K 17/967* | (2006.01) |

(52) U.S. Cl.
CPC ....... *G08B 3/1083* (2013.01); *H01H 13/7057* (2013.01); *H03K 17/967* (2013.01); *H04W 4/029* (2018.02); *H04W 64/00* (2013.01)

(58) Field of Classification Search
CPC ..... G08B 3/1083; H04W 4/029; H04W 64/00
USPC ........................................ 340/539.13, 539.32
See application file for complete search history.

(56) References Cited

U.S. PATENT DOCUMENTS

| | | | | |
|---|---|---|---|---|
| 5,939,981 | A  * | 8/1999 | Renney | G08B 21/0227 340/407.1 |
| 7,079,034 | B2 * | 7/2006 | Stilp | G08B 3/1083 340/10.2 |
| D639,552 | S  * | 6/2011 | Du | D3/249 |
| 8,254,958 | B2 * | 8/2012 | Johnson | H04M 1/2155 340/539.1 |
| 2003/0043037 | A1* | 3/2003 | Lay | G08B 13/1427 340/568.1 |
| 2005/0231361 | A1* | 10/2005 | Godbey | G08B 21/24 340/539.32 |
| 2007/0236347 | A1* | 10/2007 | Francois | G08B 21/24 340/539.32 |
| 2009/0075691 | A1 | 3/2009 | Yang | |
| 2012/0092160 | A1* | 4/2012 | Antonucci | G08B 21/24 340/539.32 |

FOREIGN PATENT DOCUMENTS

WO   WO2014093027   6/2014

* cited by examiner

*Primary Examiner* — Qutbuddin Ghulamali

(57) ABSTRACT

An electronic device tracking assembly for locating a misplaced electronic device includes a case that may contain an electronic device. A location unit is provided and the location unit is coupled to the case. The location unit selectively emits an audible alert thereby facilitating the case to be located. A remote unit is provided and the remote unit is selectively carried. The remote unit is selectively turned on when the electronic device is misplaced. Moreover, the remote unit turns the location unit on when the remote unit is turned on.

11 Claims, 5 Drawing Sheets

ELECTRONIC DEVICE TRACKING ASSEMBLY

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM.

Not Applicable

STATEMENT REGARDING PRIOR DISCLOSURES BY THE INVENTOR OR JOINT INVENTOR

Not Applicable

BACKGROUND OF THE INVENTION (1) Field of the Invention (2) Description of Related Art Including Information Disclosed Under 37 CFR 1.97 and 1.98

The disclosure and prior art relates to tracking devices and more particularly pertains to a new tracking device for locating a misplaced electronic device.

BRIEF SUMMARY OF THE INVENTION

An embodiment of the disclosure meets the needs presented above by generally comprising a case that may contain an electronic device. A location unit is provided and the location unit is coupled to the case. The location unit selectively emits an audible alert thereby facilitating the case to be located. A remote unit is provided and the remote unit is selectively carried. The remote unit is selectively turned on when the electronic device is misplaced. Moreover, the remote unit turns the location unit on when the remote unit is turned on.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
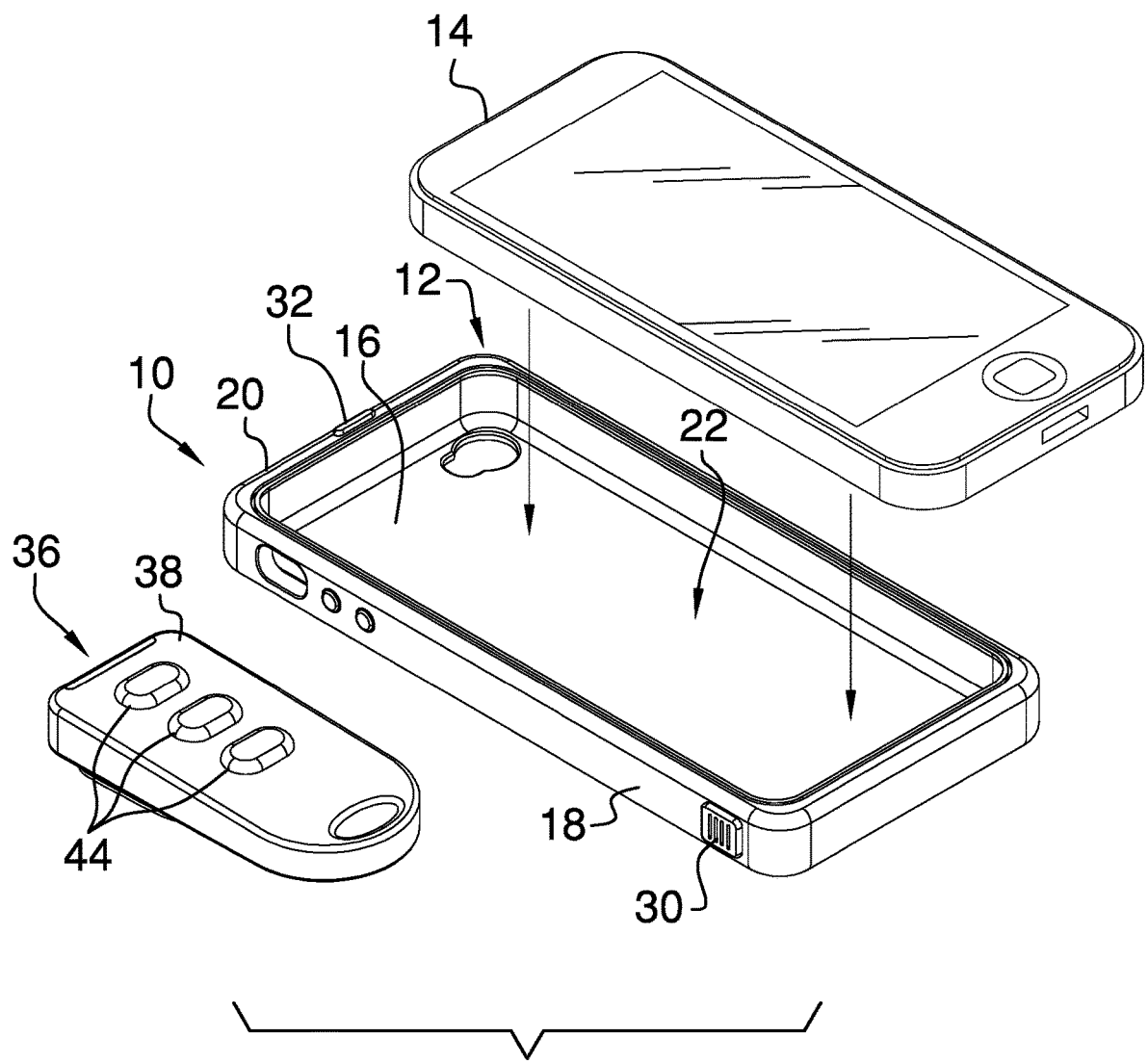
FIG. 1 is a perspective view of an electronic device tracking assembly according to an embodiment of the disclosure.
Figure 2:
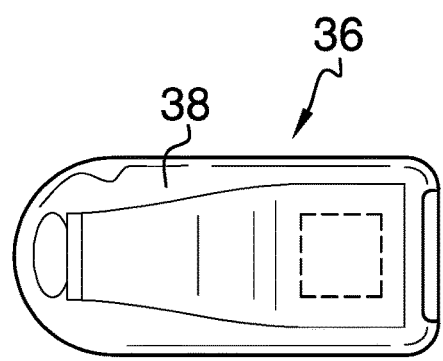
FIG. 2 is a back view of a remote unit of an embodiment of the disclosure.
Figure 3:
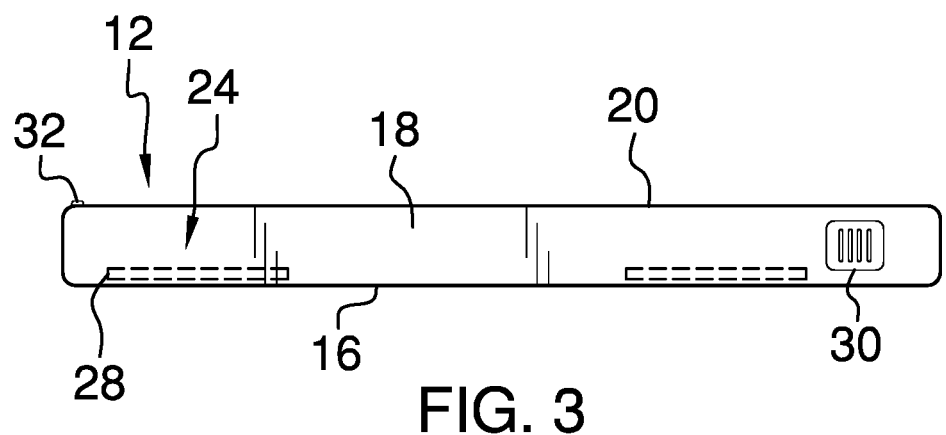
FIG. 3 is a left side phantom view of a case of an embodiment of the disclosure.
Figure 4:
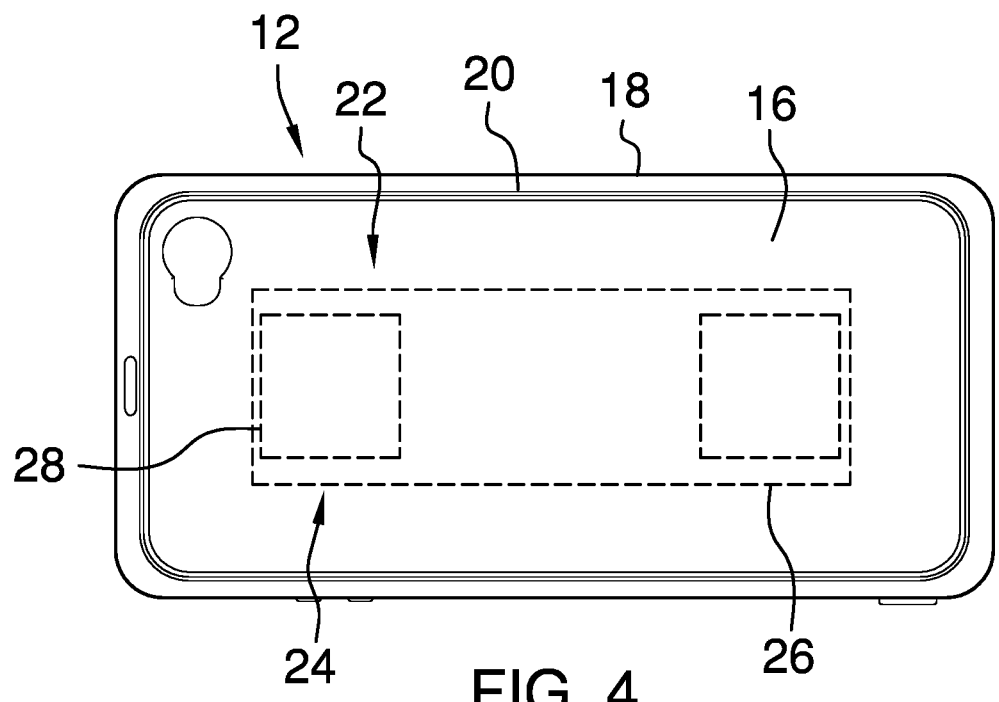
FIG. 4 is a top phantom view of a case of an embodiment of the disclosure.
Figure 5:
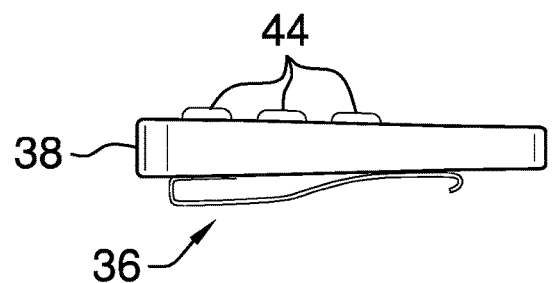
FIG. 5 is a right side view of remote unit of an embodiment of the disclosure.
Figure 6:
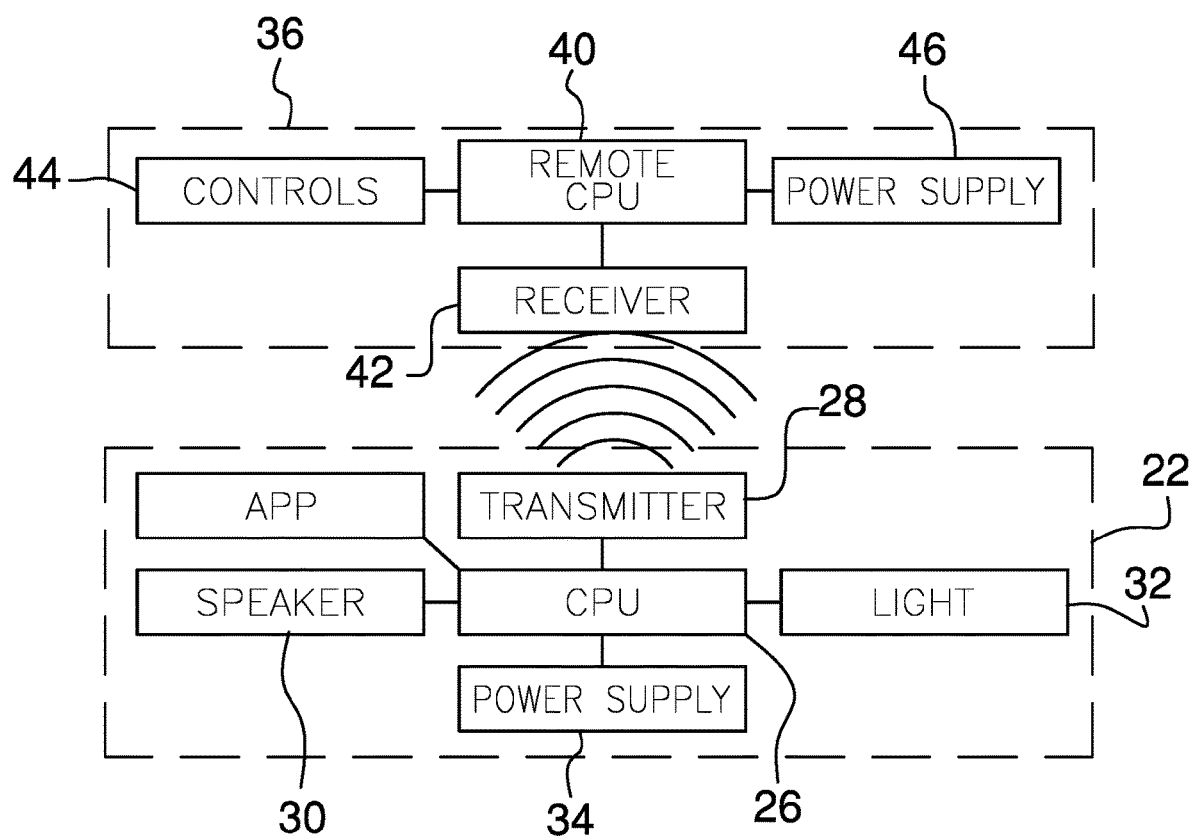
FIG. 6 is a schematic view of an embodiment of the disclosure.

With reference now to the drawings, and in particular to FIGS. 1 through 8 thereof, a new tracking device embodying the principles and concepts of an embodiment of the disclosure and generally designated by the reference numeral 10 will be described.

As best illustrated in FIGS. 1 through 8, the electronic device tracking assembly 10 generally comprises a case 12 that may contain an electronic device 14. The case 12 has a basal wall 16 and a perimeter wall 18 extending away therefrom. The perimeter wall 18 has a distal edge 20 with respect to the basal wall 16 to define an opening 22 into the case 12. The opening 22 receives the electronic device 14 having the electronic device 14 lying on the basal wall 16. The case 12 may be a smart phone case of any conventional design and the case 12 may include elements common to smart phone cases to include, but not be limited to, a camera opening and a plurality of control buttons. Additionally, the electronic device 14 may be a smart phone, a tablet pc and any other portable electronic device 14.

A location unit 24 is coupled to the case 12 and the location unit 24 selectively emits an audible alert thereby facilitating the case 12 to be located. The location unit 24 may also be internally positioned within the electronic device 14. The location unit 24 comprises a first processor 26 that is coupled to the case 12. The first processor 26 selectively generates an alert sequence and the first processor 26 may be an electronic processor or the like. A first transceiver 28 is coupled to the case 12 and the first transceiver 28 is electrically coupled to the first processor 26. The first transceiver 28 is in electrical communication with a global positioning system (gps) thereby facilitating the first transceiver 28 to establish a physical location of the case 12. In this way the location of the case 12 may be remotely tracked. The first transceiver 28 may be a radio frequency transceiver or the like.

A speaker 30 is coupled to the case 12 to emit audible sound outwardly therefrom. The speaker 30 is electrically coupled to the first processor 26 and the speaker 30 is turned on when the first processor 26 generates the alert sequence. A light emitter 32 is coupled to the case 12 to emit light outwardly therefrom. The light emitter 32 is electrically coupled to the first processor 26 and the light emitter 32 is turned on when the first processor 26 generates the alert sequence. In this way the location of the case 12 may be visually identified. The light emitter 32 may be an LED or the like and the speaker 30 may be an electronic speaker 30 or the like. A first power supply 34 is coupled to the case 12 and the first power supply 34 is electrically coupled to the first processor 26. The first power supply 34 comprises at least one battery.

A remote unit 36 is provided and the remote unit 36 carried by a user and the remote unit 36 is selectively turned on when the electronic device 14 is misplaced. The remote unit 36 turns the location unit 24 on when the remote unit 36 is turned on. The remote unit 36 comprises a housing 38 that is selectively manipulated. A second processor 40 is positioned within the housing 38 and the second processor 40 selectively generates a locate sequence.

A second transceiver 42 is positioned within the housing 38 and the second transceiver 42 is electrically coupled to the second processor 40. The second transceiver 42 is in electrical communication with the first transceiver 28 and the second transceiver 42 communicates the locate sequence to the first transceiver 28. Moreover, the first processor 26 generates the alert sequence when the first transceiver 28 receives the locate sequence. The second transceiver 42 may be a radio frequency transceiver or the like and the second processor 40 may be an electronic processor or the like.

A plurality of buttons 44 is provided and each of the buttons 44 is coupled to the housing 38. Each of the buttons 44 is electrically coupled to the second processor 40 and each of the buttons 44 controls operational parameters of the second processor 40. The second processor 40 generates the locate sequence when the buttons 44 are manipulated. The plurality of buttons 44 may include a speaker button to generate the alert sequence, a light button to generate the alert sequence and a gps button to track the location of the case.

Figure 7:
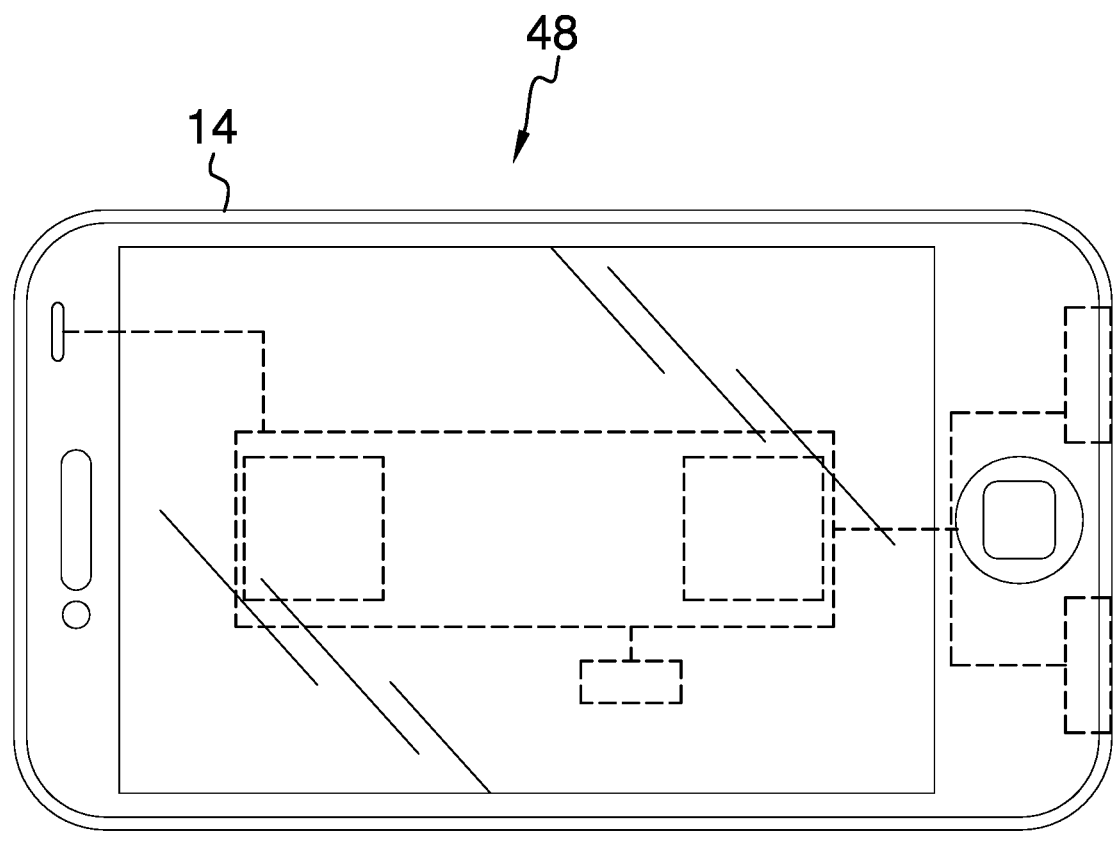
FIG. 7 is a perspective view of an alternative embodiment of the disclosure.
Figure 7:
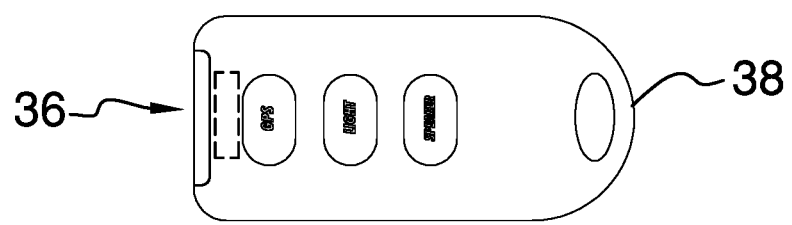
Figure 8:
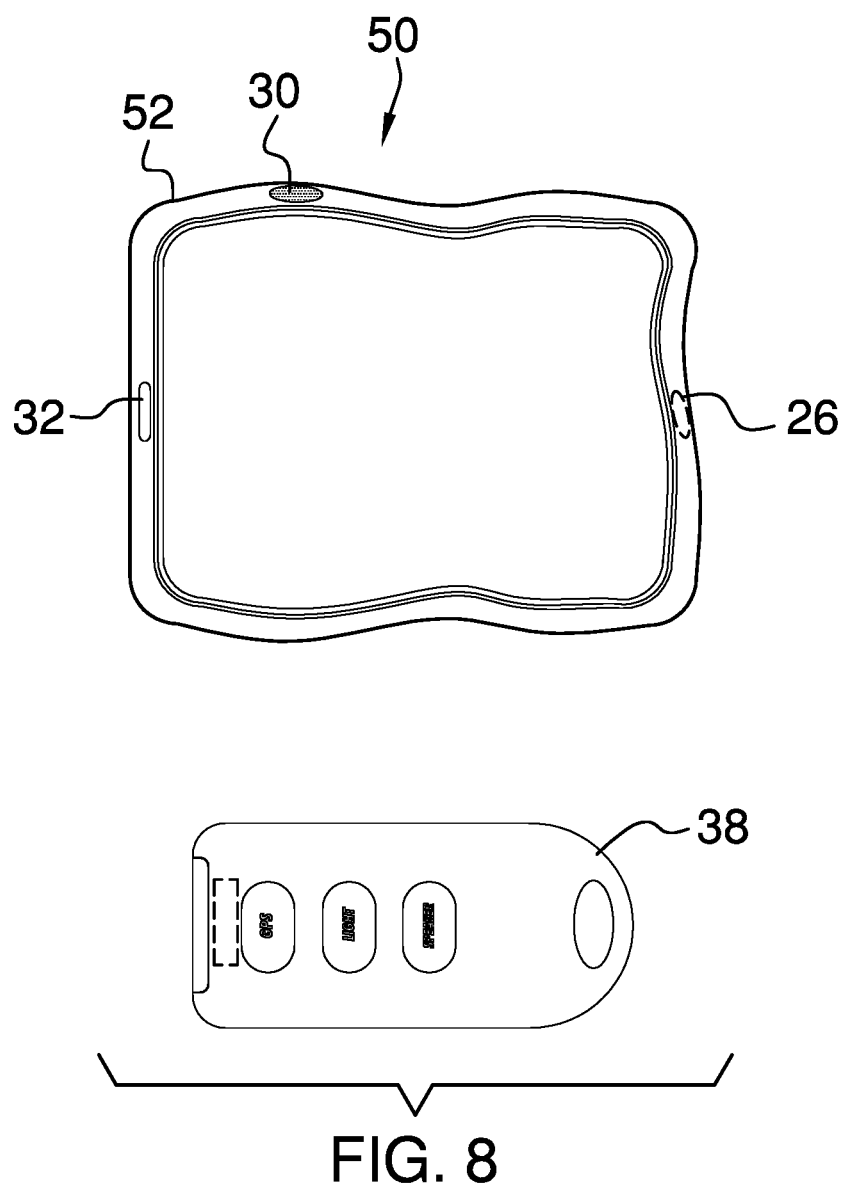
FIG. 8 is a top view of an alternative embodiment of the disclosure.

A second power supply 46 is positioned within the housing 38 the second power supply 46 is electrically coupled to the second processor 40. The second power supply 46 comprises at least one battery. In an alternative embodiment 48 as shown in FIG. 7, the remote unit 36 may be in electrical communication with internal components of the electronic device 14 such as a transceiver and speaker on the electronic device 14. In an alternative embodiment 50 as shown in FIG. 8, an elastic band 52 may be provided and the elastic band 52 may be selectively positioned around the electronic device 14. The location unit 24 may be coupled to the elastic band 52.

In use, the electronic device 14 is positioned in the case 12 and the electronic device 14 is manipulated and employed in a selected convention. The remote unit 36 is manipulated when the case 12 and the electronic device 14 are misplaced. The buttons 44 are manipulated to generate to alert sequence. Thus, the speaker 30 emits the audible alert and the light emitter 32 emits the light to facilitate the case 12 and the electronic device 14 to be located. The buttons 44 are manipulated when the electronic device 14 and the case 12 are located thereby turning the speaker 30 and the light emitter 32 off.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. An electronic device tracking assembly being configured to track a location of an electronic device when the electronic device is misplaced, said assembly comprising:
   a case being configured to contain an electronic device;
   a location unit being coupled to said case wherein said location unit is configured to selectively emit an audible alert thereby facilitating said case to be located, wherein said location unit comprises a first processor being coupled to said case, said first processor selectively generating an alert sequence;
   a remote unit being configured to be carried, said remote unit being selectively turned on when the electronic device is misplaced, said remote unit turning said location unit on when said remote unit is turned on; and
   a first transceiver being coupled to said case, said first transceiver being electrically coupled to said first processor, said first transceiver being configured to be in electrical communication with a global positioning system (gps) thereby facilitating said first transceiver to establish a physical location of said case.

2. The assembly according to claim 1, wherein said case has a basal wall and a perimeter wall extending away therefrom, said perimeter wall having a distal edge with respect to said basal wall to define an opening into said case wherein said opening is configured to receive the electronic device having said electronic device lying on said basal wall.

3. The assembly according to claim 1, further comprising a speaker being coupled to said case wherein said speaker is configured to emit audible sound outwardly therefrom, said speaker being electrically coupled to said first processor, said speaker being turned on when said processor generates said alert sequence.

4. The assembly according to claim 1, further comprising a first power supply being coupled to said case, said first power supply being electrically coupled to said first processor, said first power supply comprising at least one battery.

5. The assembly according to claim 1, wherein said remote unit comprises a housing being configured to be manipulated.

6. The assembly according to claim 5, further comprising a second processor being positioned within said housing, said second processor selectively generating a locate sequence.

7. The assembly according to claim 6, further comprising a second transceiver being positioned within said housing, said second transceiver being electrically coupled to said second processor, said second transceiver being in electrical communication with said first transceiver, said second transceiver communicating said locate sequence to said first transceiver, said first processor generating said alert sequence when said first transceiver receives said locate sequence.

8. The assembly according to claim 6, further comprising a plurality of buttons, each of said buttons being coupled to said housing wherein each of said buttons is configured to be manipulated, each of said buttons being electrically coupled to said second processor, each of said buttons controlling operational parameters of said second processor, said second processor generating said locate sequence when said buttons are manipulated.

9. The assembly according to claim 6, further comprising a second power supply being positioned within said housing, said second power supply being electrically coupled to said second processor, said second power supply comprising at least one battery.

10. An electronic device tracking assembly being configured to track a location of an electronic device when the electronic device is misplaced, said assembly comprising:
 a case being configured to contain an electronic device;
 a location unit being coupled to said case wherein said location unit is configured to selectively emit an audible alert thereby facilitating said case to be located, wherein said location unit comprises a first processor being coupled to said case, said first processor selectively generating an alert sequence;
 a remote unit being configured to be carried, said remote unit being selectively turned on when the electronic device is misplaced, said remote unit turning said location unit on when said remote unit is turned on; and
 a light emitter being coupled to said case wherein said light emitter is configured to emit light outwardly therefrom, said light emitter being electrically coupled to said first processor, said light emitter being turned on when said first processor generates said alert sequence thereby facilitating the location of said case to be visually identified.

11. An electronic device tracking assembly being configured to track a location of an electronic device when the electronic device is misplaced, said assembly comprising:
 a case being configured to contain a electronic device, said case having a basal wall and a perimeter wall extending away therefrom, said perimeter wall having a distal edge with respect to said basal wall to define an opening into said case wherein said opening is configured to receive the electronic device having said electronic device lying on said basal wall;
 a location unit being coupled to said case wherein said location unit is configured to selectively emit an audible alert thereby facilitating said case to be located, said location unit comprising:
  a first processor being coupled to said case, said first processor selectively generating an alert sequence,
  a first transceiver being coupled to said case, said first transceiver being electrically coupled to said first processor, said first transceiver being configured to be in electrical communication with a global positioning system (gps) thereby facilitating said first transceiver to establish a physical location of said case,
  a speaker being coupled to said case wherein said speaker is configured to emit audible sound outwardly therefrom, said speaker being electrically coupled to said first processor, said speaker being turned on when said processor generates said alert sequence,
  a light emitter being coupled to said case wherein said light emitter is configured to emit light outwardly therefrom, said light emitter being electrically coupled to said first processor, said light emitter being turned on when said first processor generates said alert sequence thereby facilitating the location of said case to be visually identified, and
  a first power supply being coupled to said case, said first power supply being electrically coupled to said first processor, said first power supply comprising at least one battery; and
 a remote unit being configured to be carried, said remote unit being selectively turned on when the electronic device is misplaced, said remote unit turning said location unit on when said remote unit is turned on, said remote unit comprising:
  a housing being configured to be manipulated,
  a second processor being positioned within said housing, said second processor selectively generating a locate sequence,
  a second transceiver being positioned within said housing, said second transceiver being electrically coupled to said second processor, said second transceiver being in electrical communication with said first transceiver, said second transceiver communicating said locate sequence to said first transceiver, said first processor generating said alert sequence when said first transceiver receives said locate sequence,
  a plurality of buttons, each of said buttons being coupled to said housing wherein each of said buttons is configured to be manipulated, each of said buttons being electrically coupled to said second processor, each of said buttons controlling operational parameters of said second processor, said second processor generating said locate sequence when said buttons are manipulated, and
  a second power supply being positioned within said housing, said second power supply being electrically coupled to said second processor, said second power supply comprising at least one battery.

* * * * *